(12) United States Patent
Vakanas et al.

(10) Patent No.: US 11,769,753 B2
(45) Date of Patent: Sep. 26, 2023

(54) THERMALLY-OPTIMIZED TUNABLE STACK IN CAVITY PACKAGE-ON-PACKAGE

(71) Applicant: Intel Corporation, Santa Clara, CA (US)

(72) Inventors: George Vakanas, Tempe, AZ (US); Aastha Uppal, Chandler, AZ (US); Shereen Elhalawaty, Scottsdale, AZ (US); Aaron McCann, Queen Creek, AZ (US); Edvin Cetegen, Chandler, AZ (US); Tannaz Harirchian, Scottsdale, AZ (US); Saikumar Jayaraman, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 993 days.

(21) Appl. No.: 16/051,065

(22) Filed: Jul. 31, 2018

(65) Prior Publication Data
US 2020/0043894 A1 Feb. 6, 2020

(51) Int. Cl.
*H01L 25/065* (2023.01)
*H01L 23/373* (2006.01)
*H01L 23/367* (2006.01)
*H01L 23/00* (2006.01)
*H10B 12/00* (2023.01)

(52) U.S. Cl.
CPC ........ *H01L 25/0657* (2013.01); *H01L 23/367* (2013.01); *H01L 23/3736* (2013.01); *H01L 24/49* (2013.01); *H10B 12/00* (2023.02)

(58) Field of Classification Search
CPC .................................................. H01L 23/3736
See application file for complete search history.

(56) References Cited

U.S. PATENT DOCUMENTS 5,285,352 A * 2/1994 Pastore ............... H01L 23/3677
361/707
6,265,771 B1 * 7/2001 Ference ............. H01L 23/3677
257/676

* cited by examiner

*Primary Examiner* — Yu-Hsi D Sun
(74) *Attorney, Agent, or Firm* — Schwabe, Wlliamson & Wyatt, P.C.

(57) ABSTRACT

Embodiments disclosed herein include an electronics package and methods of forming such electronics packages. In an embodiment, the electronics package comprises a package substrate, and a first die coupled to the package substrate. In an embodiment, a cavity is formed through the package substrate. In an embodiment, the cavity is within a footprint of the first die. In an embodiment, the electronics package further comprises a thermal stack in the cavity. In an embodiment, the thermal stack contacts the first die.

11 Claims, 10 Drawing Sheets

THERMALLY-OPTIMIZED TUNABLE STACK IN CAVITY PACKAGE-ON-PACKAGE

TECHNICAL FIELD

Embodiments of the disclosure are in the field of electronics packaging and, in particular, to package-on-package (PoP) systems with a thermal stack embedded in a cavity in the PoP substrate.

BACKGROUND

Providing improved thermal solutions for package-on-package PoP systems is becoming increasingly important in order to accommodate higher performance systems. In a typical PoP system, a memory package is formed above a processor package (e.g., a system on a chip (SoC)). Since the top surface of the processor package is covered by the memory package, thermal cooling of the processor package relies on thermally coupling the processor package to the memory package.

Currently, PoP systems employ an air-gap between the memory package and the mold layer of the processor package. Accordingly, it is not possible to provide a direct thermal pathway between the dies of the memory package and the dies of the processor package. Furthermore, it is to be appreciated that the memory dies also have thermal limitations and cannot be overburdened thermally by heat transfer from the processor dies.

DESCRIPTION OF THE EMBODIMENTS

Figure 1:
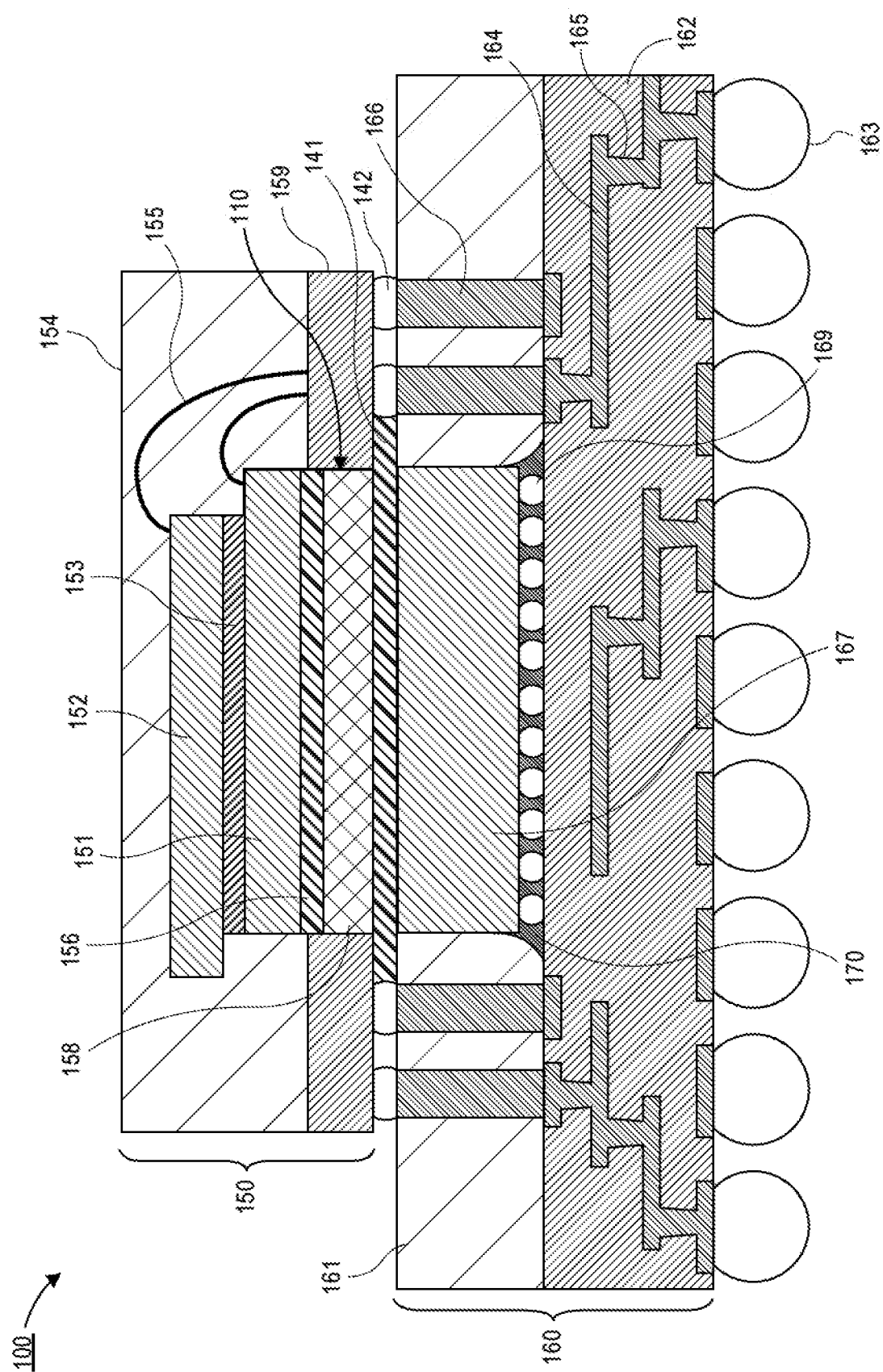
FIG. 1 is a cross-sectional illustration of a package-on-package (PoP) system that includes a thermal stack that is embedded in a package substrate, in accordance with an embodiment.

Embodiments described herein comprise package-on-package (PoP) systems with a thermal stack embedded in a cavity of the PoP substrate and methods of forming such PoP systems. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, currently available package-on-package (PoP) systems do not have adequate thermal solutions in order to account for improved performance of the system. Accordingly, embodiments disclosed herein include a thermal stack that provides a thermal pathway between the dies of a first (lower) package and the dies of a second (upper) package. In accordance with an embodiment, the thermal pathway may comprise a thermal stack that is formed in a cavity through the package substrate of the second package.

The use of a thermal stack in a cavity through the package substrate provides several advantages. One advantage is that the number of thermal interfaces is reduced since the existing PoP substrate includes alternating layers of copper and build-up material. The use of a thermal stack reduces the total number of layers between the dies of the first package and the second package. An additional advantage is that the thermal performance of the thermal stack may be optimized (e.g., by choosing materials and the thickness of those materials) to provide sufficient thermal conduction to the dies in the second package without overburdening the thermal load of the dies in the second package. That is, the thermal conduction in the Z-direction may be balanced with the thermal conduction in the X- and Y-directions in order to not exceed operating temperature maximums of the dies in the second package.

Referring now to FIG. 1, a cross-sectional illustration of an electronic system 100 is shown, in accordance with an embodiment. In an embodiment, the electronic system 100 may comprise a first package 160 and a second package 150 above the first package 160.

In an embodiment, the first package 160 may be a system on chip (SoC) package or any other suitable package. For example, the first package 160 may comprise one or more dies 167 (e.g., processors or the like) that are coupled to a first package substrate 162. In an embodiment, the one or more dies 167 may be electrically coupled to the first package substrate 162 with solder balls 169 with or without underfill material 170. While solder balls 169 are shown, it is to be appreciated that any interconnect architectures may be used to electrically couple the one or more dies 167 to the package substrate 162. In an embodiment, the first package substrate 162 may comprise traces 164, vias 165, and the like, as is known in the art. In an embodiment, the traces 164 and vias 165 may electrically couple second level interconnects 163 (e.g., solder balls) to the one or more dies 167.

In an embodiment, a mold layer 161 may be formed over the one or more dies 167 and the first package substrate 162. In an embodiment, through mold interconnects 166 may be formed through the mold layer 161. For example, the through mold interconnects 166 may be copper pillars, solder bumps, or any other suitable through mold interconnect known to those skilled in the art.

In an embodiment, the second package 150 may be electrically coupled to the first package substrate 162 by the solder balls 142 attached to the through mold interconnects 166. In an embodiment, the second package 150 may comprise a second package substrate 159 and one or more dies 151, 152. In an embodiment, the second package 150 may be a memory package. For example, the one or more dies 151, 152 may be memory dies, such as dynamic random access memory (DRAM) dies. In an embodiment the one or more dies 151, 152 may be stacked and separated from each other by a die attach film (DAF) 153. In an embodiment, the one or more dies 151, 152 may be formed over a surface of the second package substrate 159 that faces away from the first package substrate 162. In an embodiment, a mold layer 154 may be formed over the one or more dies 151, 152 and the second package substrate 159.

In an embodiment, the one or more dies 151, 152 may be electrically coupled to the second package substrate 159 with wire bonds 155. The use of wire bonds 155 allows for there to be no interconnect routing below the dies 151, 152. As such, a cavity 110 may be formed through the second package substrate 159 within the footprint of the dies 151, 152. In an embodiment, a thermal stack may fill the cavity 110. In the embodiment illustrated in FIG. 1, the thermal stack comprises a thermal interface material (TIM) 156 and a substrate 158. In an embodiment, the TIM 156 may be in direct contact with the lower die 151 and the substrate 158 may be in direct contact with the TIM 156. In an embodiment, a second TIM 141 may thermally couple the substrate 158 to the die 167 of the first package 160. Accordingly, embodiments provide a thermal stack that functions as a direct thermal pathway from a die 167 of the first package 160 to a die 151 of the second package 150.

In an embodiment, the substrate 158 in the thermal stack may be a substrate 158 that does not include any active and/or passive components. For example, the substrate 158 may not be electrically coupled to any circuitry of the electronics system 100. In an embodiment, the substrate 158 may be a monolithic substrate. For example, the substrate 158 may be silicon, copper, or any other thermally conductive material. In an embodiment, the substrate 158 may be an alloy of more than one thermally conductive material. In an embodiment, the substrate 158 may be a composite substrate comprising two or more materials (e.g., alternating layers of different materials, particulates of a first material in a matrix of a second material, or the like).

While a particular thermal stack is shown in the electronic system 100 illustrated in FIG. 1, it is to be appreciated that electronic systems 100 may comprise thermal stacks in accordance with any embodiment disclosed herein. For example, FIGS. 2A-2D provide additional thermal stacks that may be integrated into a cavity of a package substrate in accordance with various embodiments.

Figure 2A:
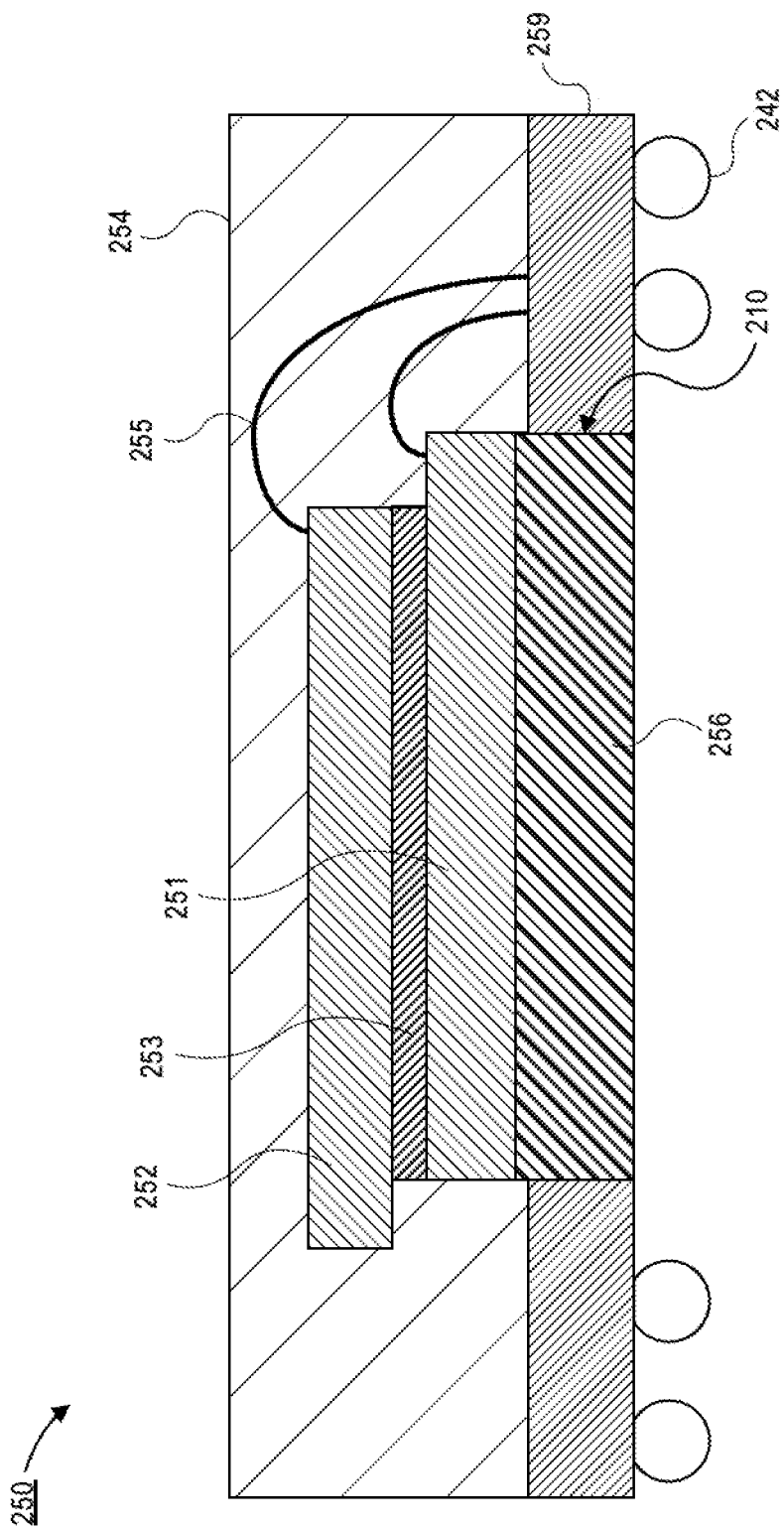
FIG. 2A is a cross-sectional illustration of a package with a thermal stack that comprises a thermal interface material (TIM), in accordance with an embodiment.

Referring now to FIG. 2A, a cross-sectional illustration of an electronics package 250 is shown, in accordance with an embodiment. In an embodiment, electronic package 250 may be substantially similar to electronics package 150 described above, with the exception of the substrate 158 being omitted from the thermal stack. As shown, the electronics package 250 may comprise a package substrate 259 and one or more dies 251, 252 attached to the package substrate 259 with wire bonds 255. In an embodiment, a DAF 253 or the like may separate the dies 251, 252 from each other. In an embodiment, the one or more dies 251, 252 may be memory dies (e.g., DRAM) or the like. In an embodiment, a mold layer 254 may be formed over the one or more dies 251, 252 and the package substrate 259. In an embodiment solder balls 242 may be coupled to the package substrate 259.

According to an embodiment, a cavity 210 may be formed through the package substrate 259. In an embodiment, the cavity 210 may be formed underneath the dies 251, 252 since there is no need for electrical routing in the package substrate 259 since the dies 251, 252 are wire bonded to the periphery of the package substrate 259. In an embodiment, the thermal stack may fill the cavity 210. For example, the thermal stack in FIG. 2A may comprise a TIM 256. For example, the TIM 256 may entirely fill the cavity 210. In an embodiment, the TIM 256 may be any suitable material that provides the desired thermal resistance. For example, the TIM 256 may comprise a particle filled polymer or the like.

Figure 2B:
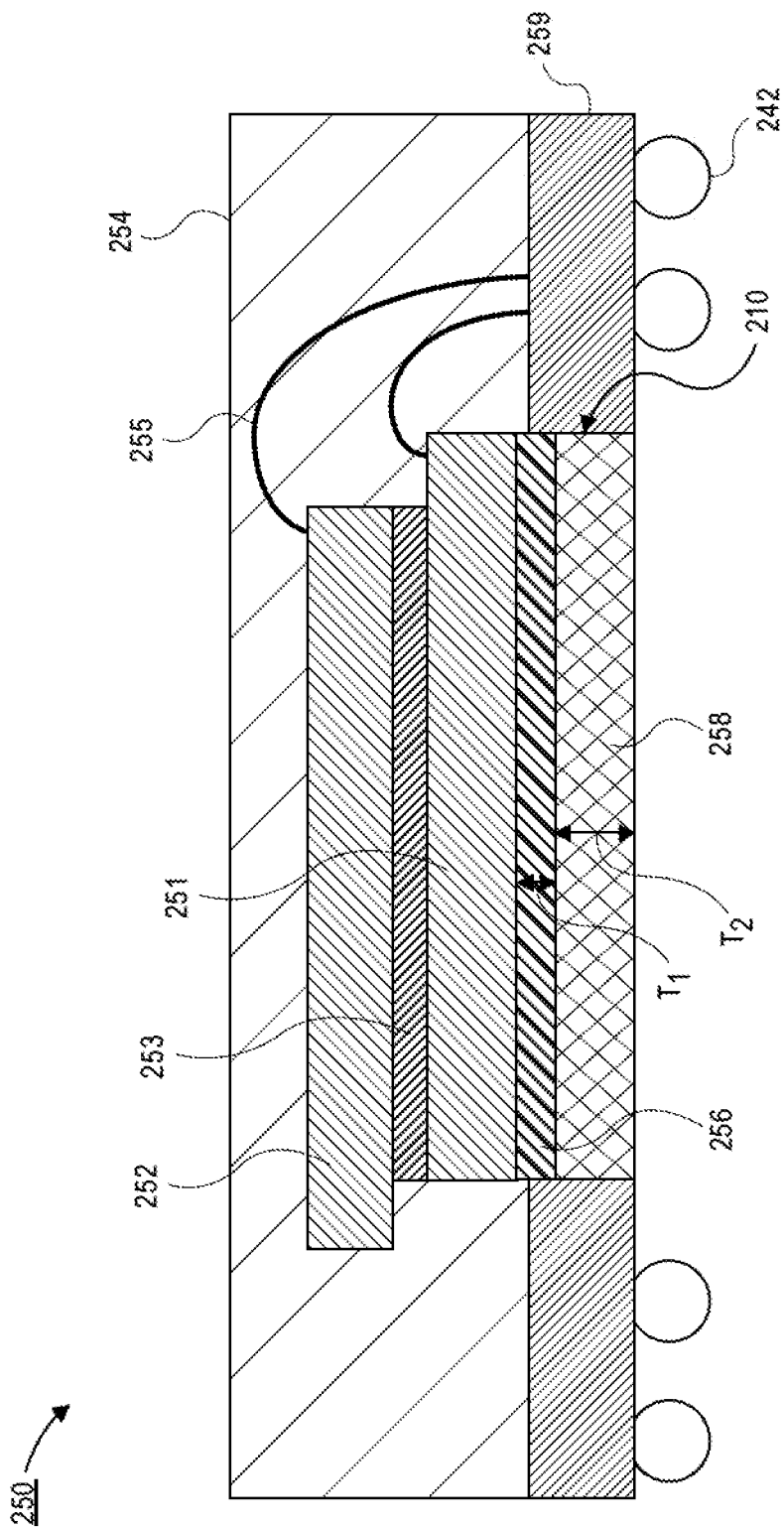
FIG. 2B is a cross-sectional illustration of a package with a thermal stack that comprises a TIM and a substrate, in accordance with an embodiment.

Referring now to FIG. 2B, a cross-sectional illustration of an electronics package 250 is shown, in accordance with an additional embodiment. In an embodiment, the electronics package 250 is substantially similar to the electronics package 250 described with respect to FIG. 2A, with the exception that the thermal stack is different. In an embodiment, the thermal stack may comprise a TIM 256 and a substrate 258. The combination of a TIM 256 and a substrate 258 provides additional control of the thermal performance of the thermal stack. For example, the substrate 258 may be a material with a high thermal conductivity (e.g., silicon or copper), and the TIM 256 may be a material that has a lower thermal conductivity. By controlling a thickness $T_1$ of the TIM 256 and a thickness $T_2$ of the substrate 258, a thermal pathway with desired characteristics may be formed. Such an embodiment may be useful to balance the heat transfer in the Z-direction with the heat transfer in the X- and Y-directions in order to prevent the die 251 from being heated beyond a maximum operating temperature. In an embodiment, the first thickness $T_1$ may be less than the second thickness $T_2$. In an embodiment, the first thickness $T_1$ may be substantially equal to the second thickness $T_2$. In an embodiment, the first thickness $T_1$ may be greater than the second thickness $T_2$.

In an embodiment, the substrate 258 in the thermal stack may be a substrate 258 that does not include any active and/or passive components. For example, the substrate 258 may not be electrically coupled to any circuitry of the electronics package 250. In an embodiment, the substrate 258 may be a monolithic substrate. For example, the substrate 258 may be silicon, copper, or any other thermally conductive material. In an embodiment, the substrate 258 may be an alloy of more than one thermally conductive material. In an embodiment, the substrate 258 may be a composite substrate comprising two or more materials (e.g., alternating layers of different materials, particulates of a first material in a matrix of a second material, or the like).

Figure 2C:
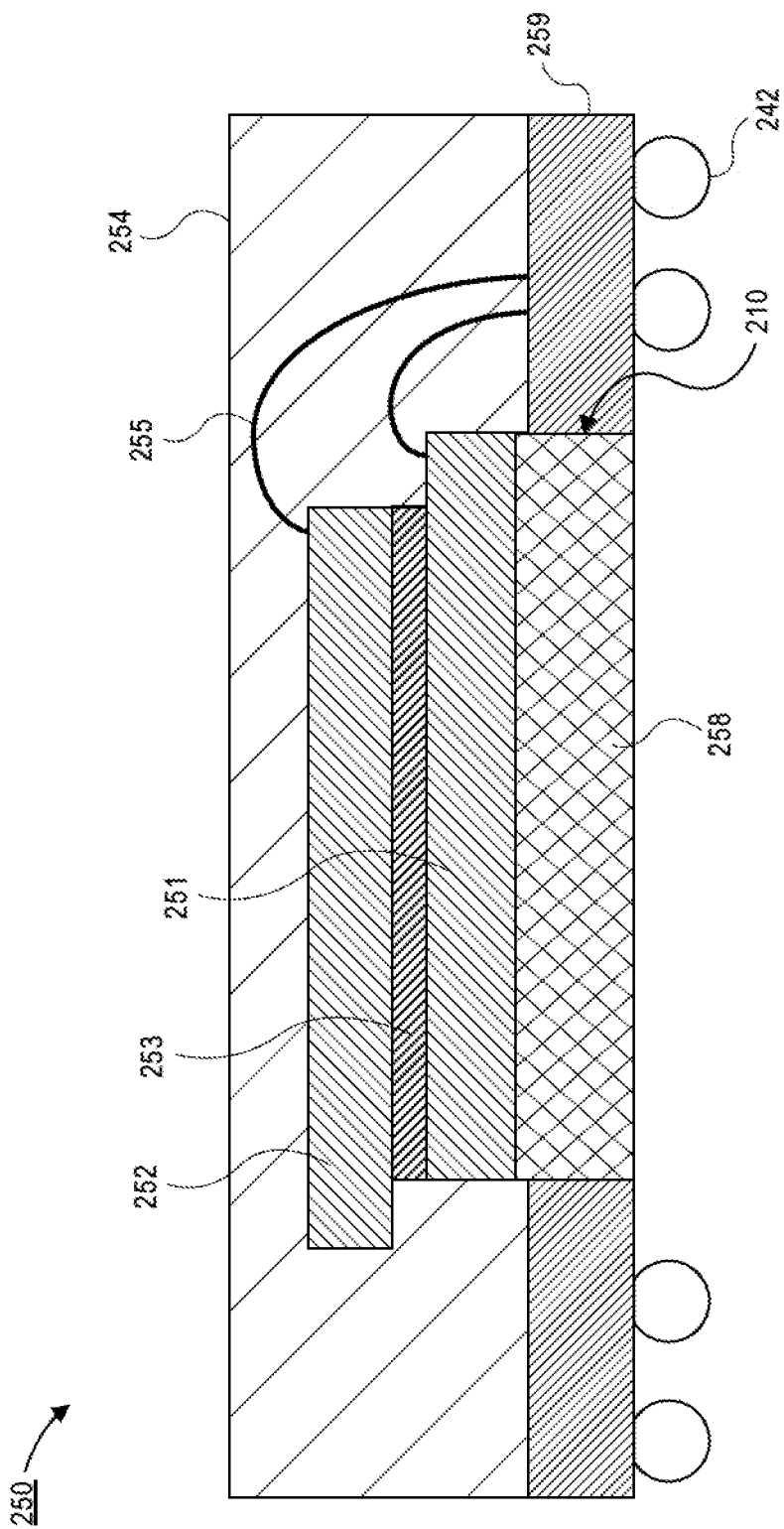
FIG. 2C is a cross-sectional illustration of a package with a thermal stack that comprises a substrate, in accordance with an embodiment.

Referring now to FIG. 2C, a cross-sectional illustration of an electronics package 250 is shown, in accordance with an additional embodiment. In an embodiment, the electronics package 250 is substantially similar to the electronics package 250 described with respect to FIG. 2A, with the exception that the thermal stack is different. For example, the thermal stack may include a substrate 258 that completely fills the cavity 210. In an embodiment, the substrate 258 may directly contact a surface of the die 251.

Figure 2D:
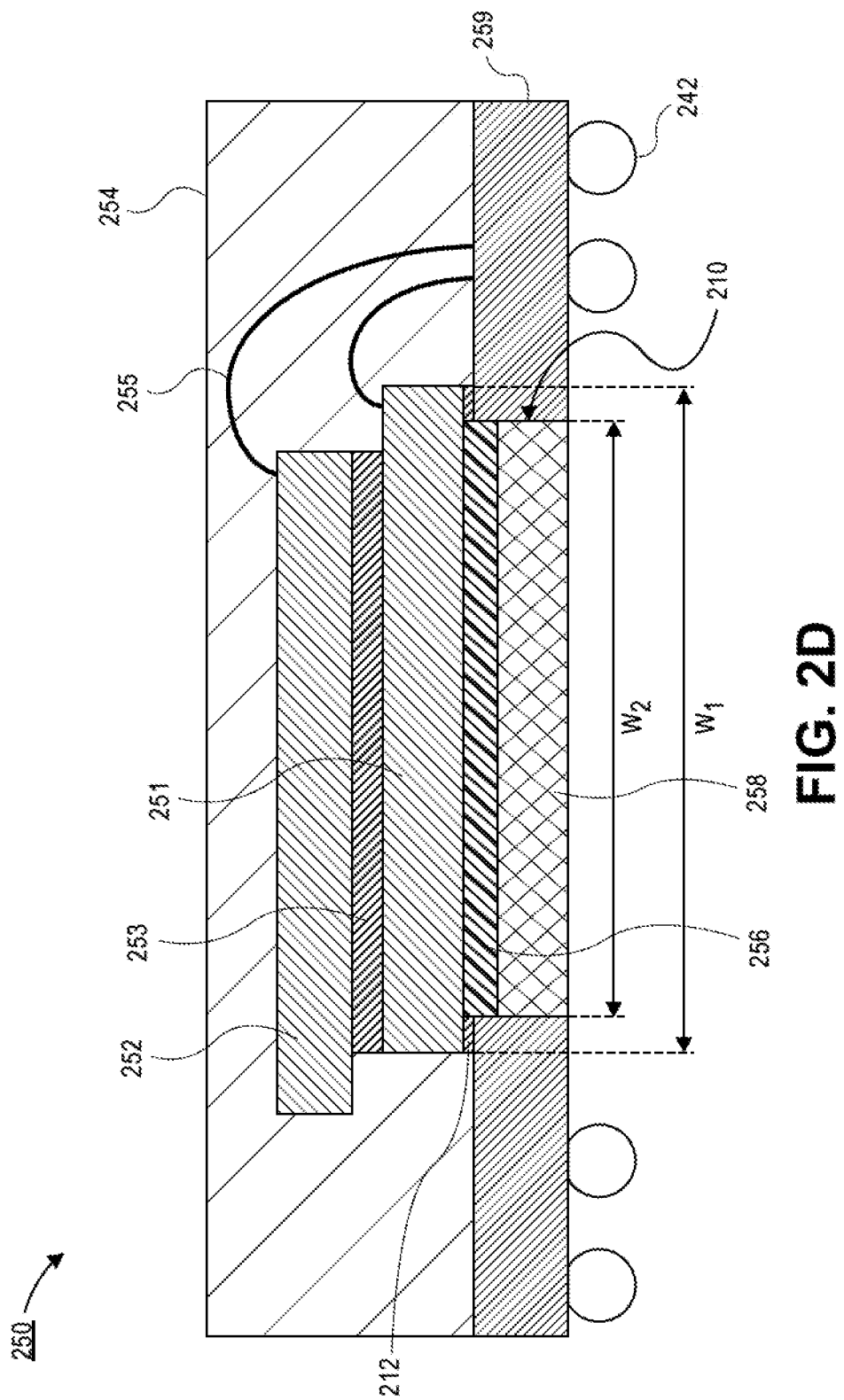
FIG. 2D is a cross-sectional illustration of a package with a thermal stack that has a width that is less than a width of the die on the package, in accordance with an embodiment.

Referring now to FIG. 2D, a cross-sectional illustration of an electronics package 250 is shown, in accordance with an additional embodiment. In an embodiment, the electronics package 250 is substantially similar to the electronics package 250 described with respect to FIG. 2A, with the exception that the thermal stack and the cavity are different. In an embodiment, the cavity 210 formed below the die 251 has a width $W_2$ that is less than a width $W_1$ of the die 251. In such an embodiment, the entire bottom surface of the die 251 may not be exposed by the cavity. In an embodiment, the portions of the die 251 that are not exposed by the cavity may be attached to the package substrate 259 with a die backside film 212.

Referring now to FIGS. 3A-3D, a series of cross-sectional illustrations are shown that illustrate a process that may be used to form an electronics package with a substrate in cavity thermal stack. While a particular processing flow is shown in the Figures, it is to be appreciated that embodiments are not limited to any particular process flow for forming the thermal stack.

Figure 3A:
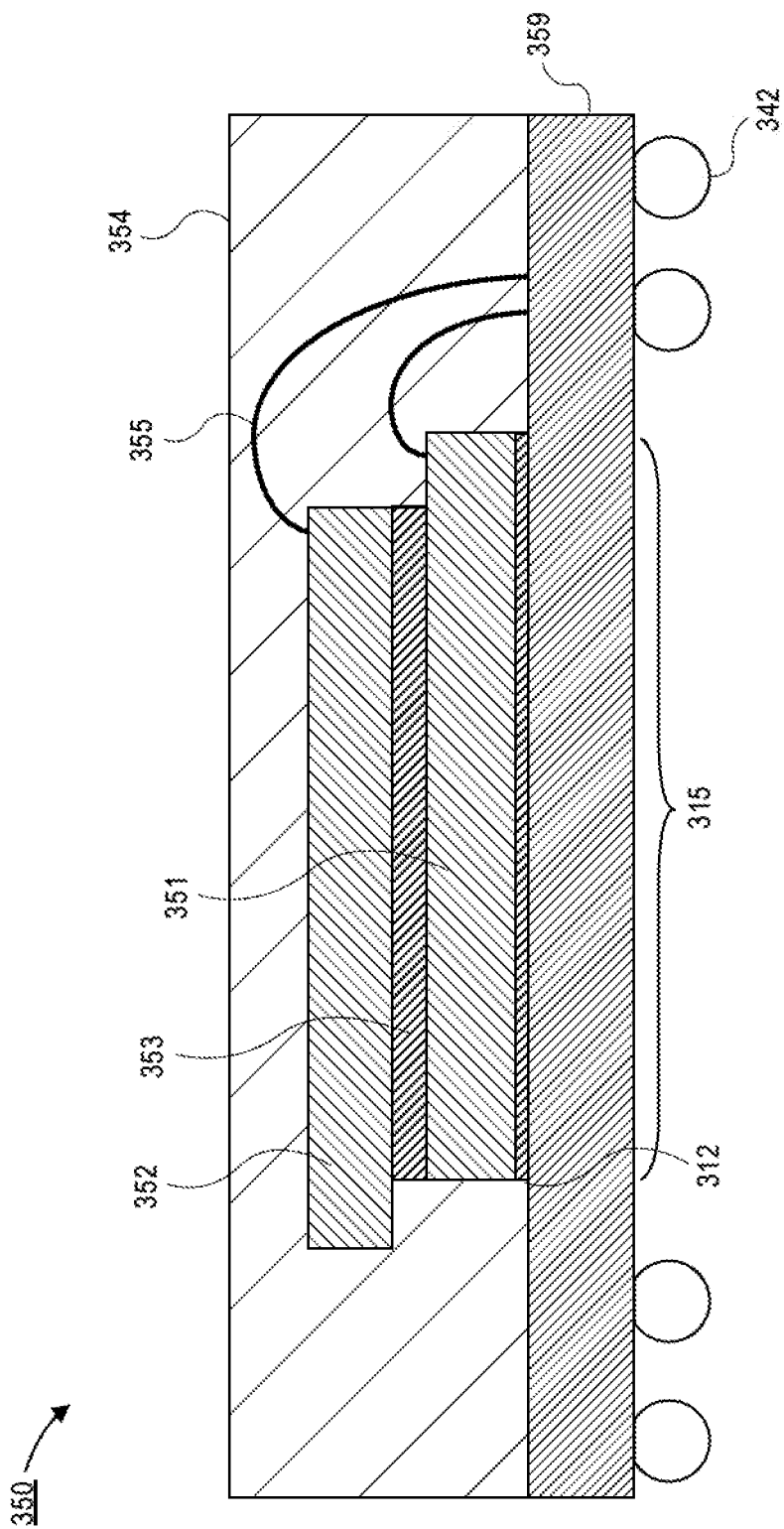
FIG. 3A is a cross-sectional illustration of a package that comprises a plurality of dies over a package substrate, in accordance with an embodiment.

Referring now to FIG. 3A, a cross-sectional illustration of an electronics package 350 is shown, in accordance with an embodiment. In an embodiment, the electronics package 350 may comprise one or more dies 351, 352 that are coupled to a package substrate 359. In an embodiment, the one or more dies 351, 352 may be electrically coupled to the package substrate 359 with wire bonds 355. The use of wire bonds 355 allows for electrical routing below the one or more dies 351, 352 to be omitted. In some embodiments, there may be dummy routing (e.g., routing layers that are not used for electrical connections in the system) (not shown) in the portion 315 of the package substrate 359 between solder bumps 342 and below the one or more dies 351, 352.

In an embodiment, the die 351 may be attached to the package substrate 359 with a die attach film 312. In an embodiment, the second die 352 may be stacked over the first die 351 and attached with a die attach film 353, or the like. In an embodiment, the one or more dies 351, 352 may be any type of die. In a particular embodiment, the one or more dies 351, 352 may be memory dies (e.g., DRAM dies). In an embodiment, a mold layer 354 may be formed over the one or more dies 351, 352 and the package substrate 359.

Figure 3B:
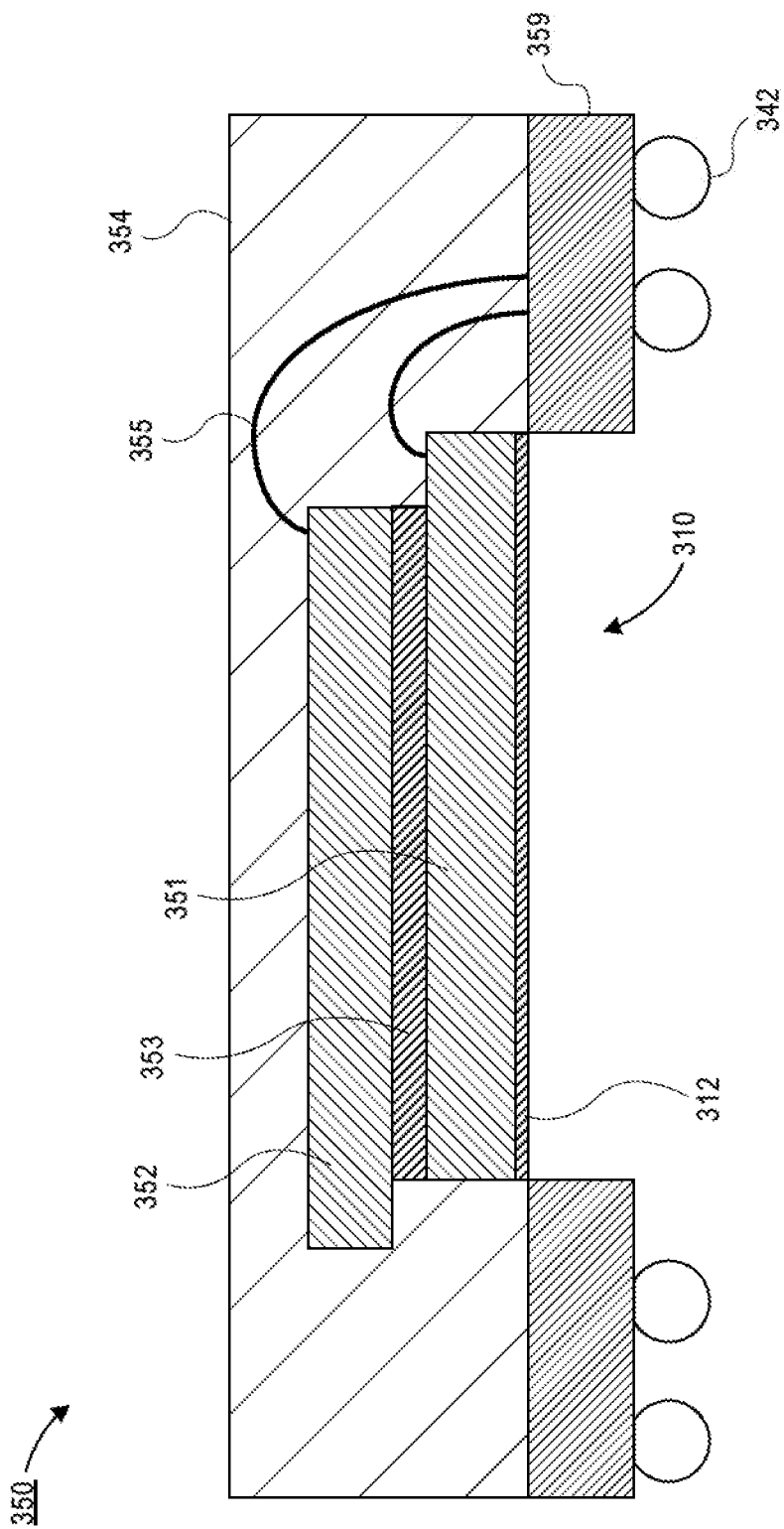
FIG. 3B is a cross-sectional illustration of the package after a cavity is formed through the package substrate, in accordance with an embodiment.

Referring now to FIG. 3B, a cross-sectional illustration after a cavity 310 is formed into the package substrate is shown, in accordance with an embodiment. In an embodiment, the cavity 310 may be formed in the portion 315 of the package substrate 359 that is below the one or more dies 351, 352. In an embodiment, the cavity 310 may be formed with a laser drilling process, or any other suitable process. The use of a laser drilling process may be particularly beneficial since laser drilling tools may already be present in the assembly environment. For example, a laser may be used for laser marking (not shown) the backside surface of the package substrate prior to the formation of the cavity 310.

In an embodiment, the cavity 310 may be substantially the same width of the die 351, though embodiments are not limited to such configurations. For example, the cavity may have a width that is less than the width of the die 351 (similar to what is shown in FIG. 2D). In an embodiment, the cavity 310 may expose the die attach film 312.

Figure 3C:
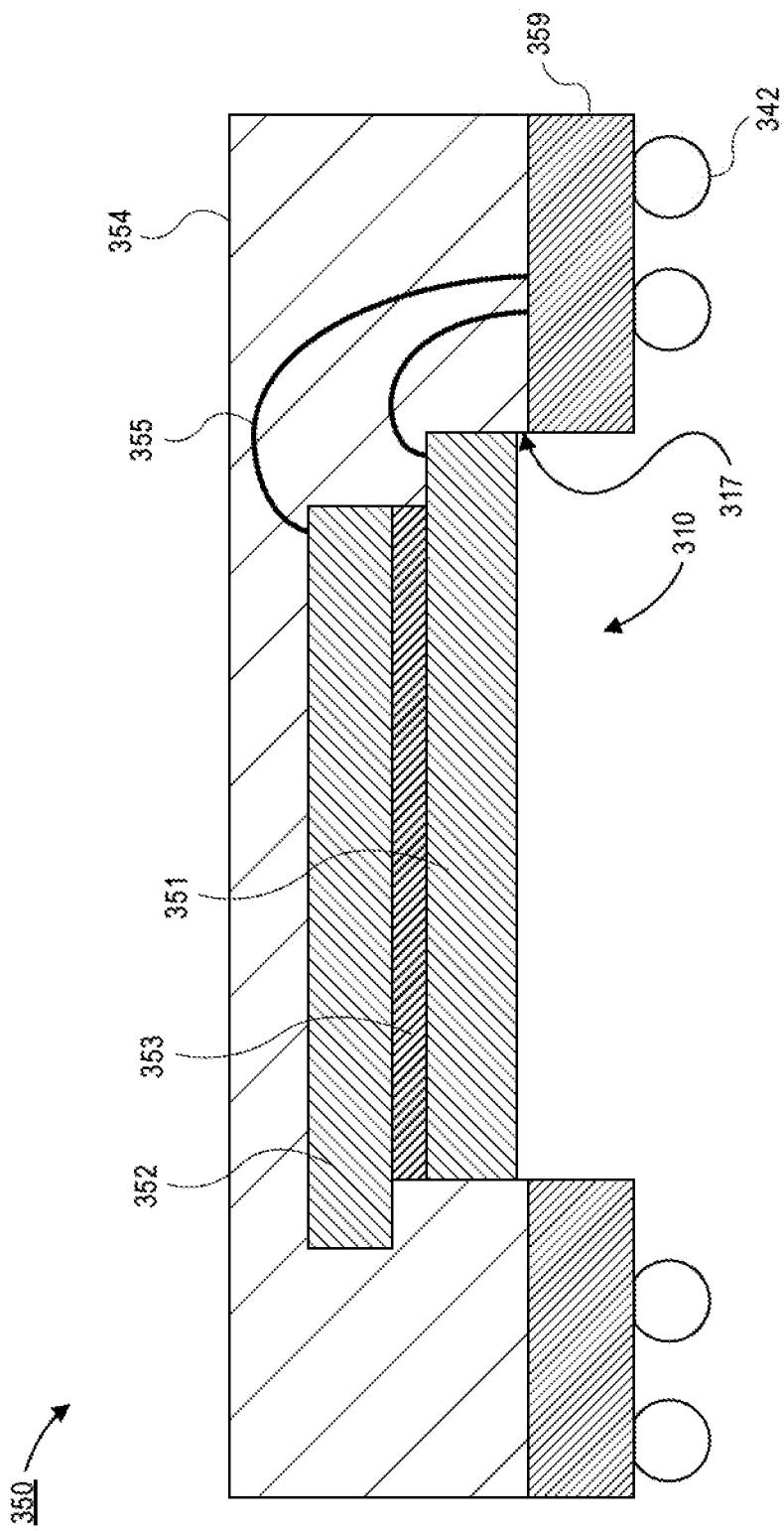
FIG. 3C is a cross-sectional illustration after the die surface exposed by the cavity is cleaned, in accordance with an embodiment.

Referring now to FIG. 3C, a cross-sectional illustration is shown after the backside surface of the die 351 is cleaned is shown, in accordance with an embodiment. In an embodiment, the die 351 may be cleaned with a plasma cleaning process, or the like. In an embodiment, the plasma clean may remove the die attach film 312 on the backside of the die 351. In an embodiment, the removal of the die attach film 312 may result in a portion 317 of the mold layer 354 being exposed.

Figure 3D:
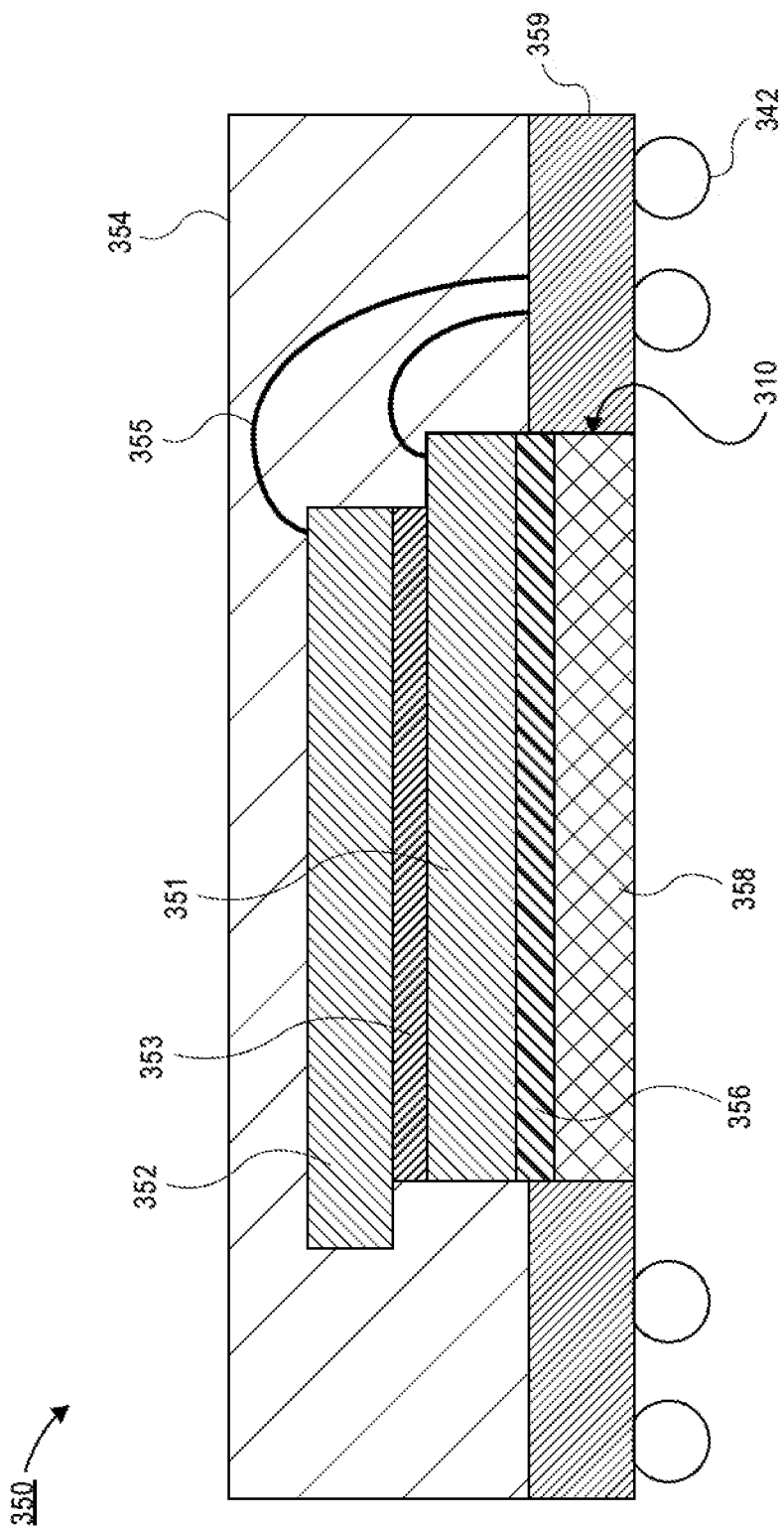
FIG. 3D is a cross-sectional illustration after a substrate and TIM is placed in the cavity, in accordance with an embodiment.

Referring now to FIG. 3D, a cross-sectional illustration after a thermal stack is placed in the cavity 310 is shown, in accordance with an embodiment. In an embodiment, the thermal stack may be any thermal stack described above in accordance with embodiments described herein. In the illustrated embodiment, the thermal stack includes a TIM 356 and a substrate 358.

In an embodiment, the substrate 358 in the thermal stack may be a substrate 358 that does not include any active and/or passive components. For example, the substrate 358 may not be electrically coupled to any circuitry of the electronics package 350. In an embodiment, the substrate 358 may be a monolithic substrate. For example, the substrate 358 may be silicon, copper, or any other thermally conductive material. In an embodiment, the substrate 358 may be an alloy of more than one thermally conductive material. In an embodiment, the substrate 358 may be a composite substrate comprising two or more materials (e.g., alternating layers of different materials, particulates of a first material in a matrix of a second material, or the like). In an embodiment, the TIM 356 may be any suitable material that provides the desired thermal resistance. For example, the TIM 356 may comprise a particle filled polymer or the like.

In an embodiment, the TIM 356 may be applied to the substrate 358 prior to being placed in the cavity 310. In other embodiments, the TIM 356 may be applied to the backside surface of the die 351 and the substrate 358 may then be placed in the cavity 310 (e.g., with a pick and place tool). In the illustrated embodiment, a portion of the thermal stack may contact the mold layer 354. In the illustrated embodiment, a surface of the thermal stack may be substantially coplanar with a surface of the package substrate 359. However, embodiments may also include a thermal stack that is not coplanar with a surface of the package substrate 359. For example, the thermal stack may not completely fill the cavity 310, or the thermal stack may extend past the cavity 310.

In an embodiment, the exposed surface of the thermal stack (e.g., the exposed surface of the substrate 358) may be cleaned after the thermal stack is placed in the cavity. For example, the substrate 358 may be cleaned with a plasma cleaning process or the like. In an embodiment, after the substrate 358 is cleaned, a second TIM (not shown) may be applied to the substrate 358 and the electronics package 350 may be attached to a second electronics package similar to the embodiment illustrated in FIG. 1.

Figure 4:
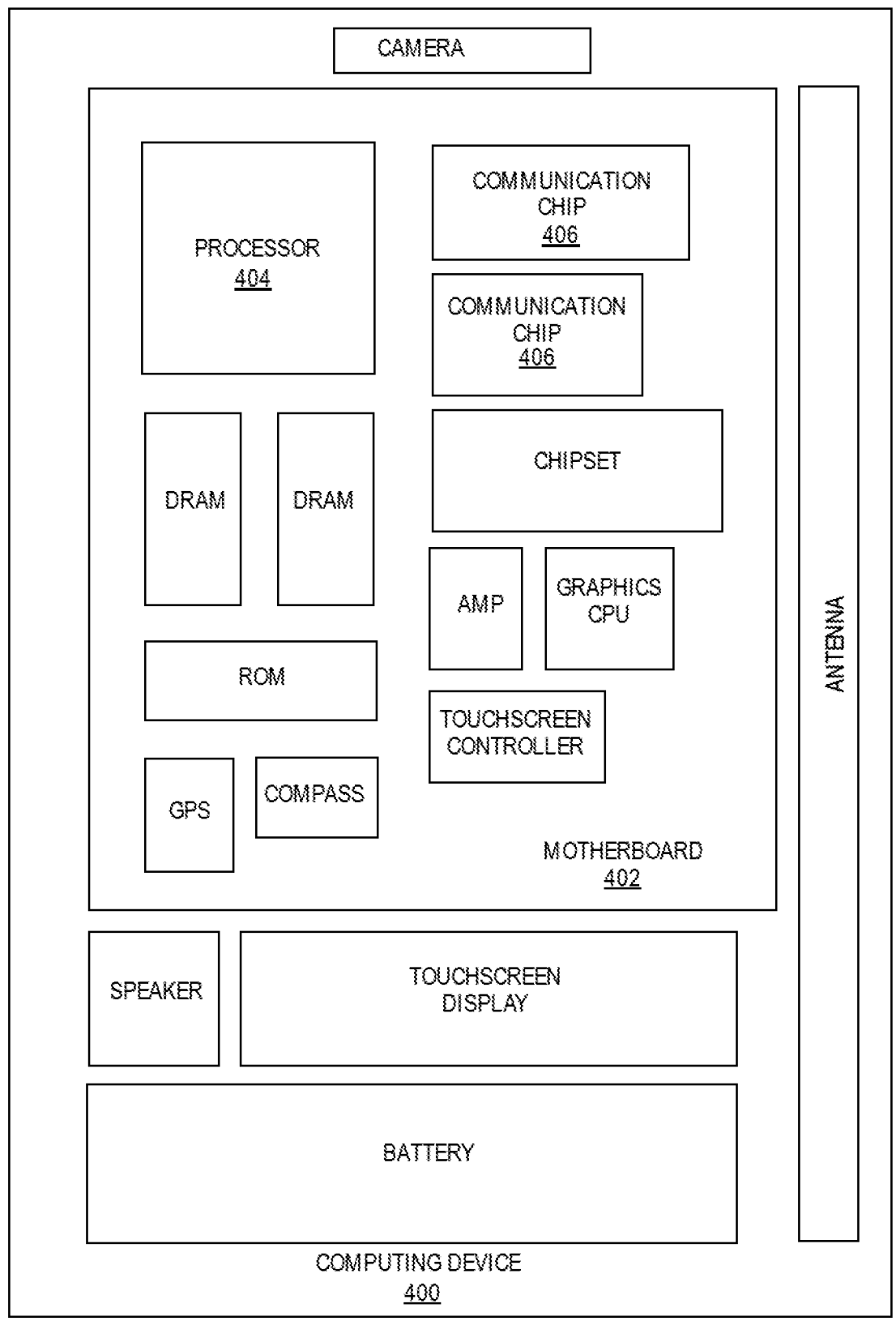
FIG. 4 is a schematic of a computing device built in accordance with an embodiment.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor may be communicatively coupled to an organic electronics package that comprises a thermal stack embedded in a cavity through the electronics package, in accordance with embodiments described herein. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip may be communicatively coupled to an organic electronics package that comprises a thermal stack embedded in a cavity through the electronics package, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronics package, comprising: a package substrate; a first die coupled to the package substrate; a cavity through the package substrate, wherein the cavity is within a footprint of the first die; and a thermal stack in the cavity, wherein the thermal stack contacts the first die.

Example 2: the electronics package of Example 1, wherein the thermal stack comprises a thermal interface material (TIM).

Example 3: the electronics package of Example 1 or Example 2, wherein the thermal stack comprises a substrate.

Example 4: the electronics package of Examples 1-3, wherein the substrate comprises copper.

Example 5: the electronics package of Examples 1-4, wherein the substrate comprises silicon.

Example 6: the electronics package of Examples 1-5, wherein the thermal stack further comprises a TIM between the substrate and the first die.

Example 7: the electronics package of Examples 1-6, wherein a width of the cavity is less than a width of the first die.

Example 8: the electronics package of Examples 1-7, further comprising a mold layer over the first die and the package substrate.

Example 9: the electronics package of Examples 1-8, wherein the thermal stack contacts a portion of the mold layer and the first die.

Example 10: the electronics package of Examples 1-9, further comprising a second die over the first die.

Example 11: the electronics package of Examples 1-10, wherein the first die and the second die are electrically coupled to the package substrate with wire bonds.

Example 12: the electronics package of Examples 1-11, wherein the first die and the second die are memory dies.

Example 13: the electronics package of Examples 1-12, wherein the first die and the second die are dynamic random access memory (DRAM) memory dies.

Example 14: an electronics system, comprising: a first package substrate; a first die coupled to the first package substrate; a mold layer over the first package substrate; a second package substrate above the first die, wherein the second package has a first surface that faces the first package and a second surfaces that faces away from the first package, and wherein the second package substrate is electrically coupled to the first package substrate by through mold interconnects that pass through the mold layer; a second die on the second surface of the second package substrate; and a thermal stack that thermally couples the first die to the second die, wherein the thermal stack passes through the second package substrate.

Example 15: the electronics system of Example 14, wherein the thermal stack is embedded in a cavity through the second package substrate.

Example 16: the electronics system of Example 14 or Example 15, wherein the thermal stack is within a footprint of the second die.

Example 17: the electronics system of Examples 14-16, wherein the thermal stack comprises a thermal interface material (TIM).

Example 18: the electronics system of Examples 14-17, wherein the thermal stack further comprises a substrate, wherein the TIM separates the substrate from the second die.

Example 19: the electronics system of Examples 14-18, wherein the thermal stack further comprises a second TIM that separates the substrate from the first die.

Example 20: the electronics system of Examples 14-19, wherein the substrate comprises copper.

Example 21: the electronics system of Examples 14-20, wherein the substrate comprises silicon.

Example 22: the electronics system of Examples 14-21, further comprising a second mold layer over the second die and the second package substrate, wherein the thermal stack contacts the second mold layer.

Example 23: a method of forming a thermal stack in a package substrate, comprising: forming a cavity through a package substrate, wherein the cavity is within a footprint of a first die coupled to the package substrate; cleaning the surface of the first die exposed by the cavity; and depositing a thermal stack in the cavity.

Example 24: the method of Example 23, wherein depositing a thermal stack in the cavity comprises: depositing a thermal interface material over the surface of the first die exposed by the cavity; and placing a substrate over the thermal interface material.

Example 25: the method of Example 23 or Example 24, wherein the substrate comprises copper or silicon.

What is claimed is:

1. An electronics package, comprising:
a package substrate;
a first die coupled to the package substrate, the first die having a bottommost surface above an uppermost surface of an entirety of the package substrate;
a second die over the first die, wherein the first die and the second die are electrically coupled to the package substrate with wire bonds;
a cavity through the package substrate, wherein the cavity is within a footprint of the first die; and
a thermal stack in the cavity, wherein the thermal stack directly physically contacts the first die, and wherein the thermal stack is within the footprint of the first die.

2. The electronics package of claim 1, wherein the thermal stack comprises a thermal interface material (TIM).

3. The electronics package of claim 1, wherein the thermal stack comprises a substrate.

4. The electronics package of claim 3, wherein the substrate comprises copper.

5. The electronics package of claim 3, wherein the substrate comprises silicon.

6. The electronics package of claim 3, wherein the thermal stack further comprises a TIM between the substrate and the first die.

7. The electronics package of claim 1, wherein a width of the cavity is less than a width of the first die.

8. The electronics package of claim 1, further comprising a mold layer over the first die and the package substrate.

9. The electronics package of claim 8, wherein the thermal stack contacts a portion of the mold layer and the first die.

10. The electronics package of claim 1, wherein the first die and the second die are memory dies.

11. The electronics package of claim 10, wherein the first die and the second die are dynamic random access memory (DRAM) memory dies.

\* \* \* \* \*